(12) United States Patent
Panetta et al.

(10) Patent No.: US 11,934,906 B2
(45) Date of Patent: Mar. 19, 2024

(54) HYBRID TRANSACTION CARD READER SYSTEM

(71) Applicant: BANKS AND ACQUIRERS INTERNATIONAL HOLDING, Paris (FR)

(72) Inventors: Florence Panetta, La Chapelle-en-Vercors (FR); Olivier Fabregoule, Guilherand Granges (FR); Roger Devornique, Valence (FR); Pierre Morel, Charpey (FR); Richard Allirot, Corenc (FR)

(73) Assignee: BANKS AND ACQUIRERS INTERNATIONAL HOLDING, Paris (FR)

( * ) Notice: Subject to any disclaimer, the term of this patent is extended or adjusted under 35 U.S.C. 154(b) by 84 days.

(21) Appl. No.: 17/620,821

(22) PCT Filed: Jun. 19, 2020

(86) PCT No.: PCT/EP2020/067235
§ 371 (c)(1),
(2) Date: Dec. 20, 2021

(87) PCT Pub. No.: WO2020/254651
PCT Pub. Date: Dec. 24, 2020

(65) Prior Publication Data
US 2022/0309257 A1 Sep. 29, 2022

(30) Foreign Application Priority Data

Jun. 20, 2019 (FR) ...................................... 1906684

(51) Int. Cl.
*G06K 7/00* (2006.01)
*H05K 1/02* (2006.01)

(52) U.S. Cl.
CPC ......... *G06K 7/0004* (2013.01); *G06K 7/0078* (2013.01); *H05K 1/0275* (2013.01)

(58) Field of Classification Search
CPC ... G06K 7/0004; G06K 7/0078; H05K 1/0275
See application file for complete search history.

(56) References Cited

U.S. PATENT DOCUMENTS 9,792,463 B2 * 10/2017 Miller ..................... G07F 19/00
10,312,625 B2 * 6/2019 Andre ................... G06K 7/0056
(Continued)

FOREIGN PATENT DOCUMENTS

| EP | 1432031 A1 | 6/2004 |
| FR | 2889756 A1 | 2/2007 |

OTHER PUBLICATIONS

International Search Report dated Aug. 26, 2020 for corresponding International Application No. PCT/EP2020/067235, dated Jun. 19, 2020.

(Continued)

*Primary Examiner* — Seung H Lee
(74) *Attorney, Agent, or Firm* — David D. Brush; Westman, Champlin & Koehler, P.A.

(57) ABSTRACT

A hybrid transaction card reader system includes a hybrid transaction card reader and a device for protecting the hybrid reader. The hybrid transaction card reader includes a magnetic strip reader and a chip reader. The device for protecting the hybrid reader includes an upper protective printed circuit and a lower protective printed circuit. The hybrid reader further includes a lateral protective printed circuit which includes a superposition of unitary printed circuits, the plane of superposition of the unitary printed circuits being parallel to the plane of the upper protective printed circuit and to the plane of the lower protective printed circuit.

8 Claims, 6 Drawing Sheets

(56) References Cited

U.S. PATENT DOCUMENTS

| | | | |
|---|---|---|---|
| 10,579,838 B2* | 3/2020 | Sun | G06K 7/087 |
| 2004/0120101 A1* | 6/2004 | Cohen | H05K 1/141 |
| | | | 361/654 |
| 2009/0108061 A1* | 4/2009 | Tartavull | G06K 7/0004 |
| | | | 235/380 |
| 2010/0327856 A1 | 12/2010 | Lowy | |
| 2013/0103190 A1* | 4/2013 | Carapelli | G07F 9/026 |
| | | | 700/237 |

OTHER PUBLICATIONS

Written Opinion of the International Searching Authority dated Aug. 26, 2020 for corresponding International Application No. PCT/EP2020/067235, filed Jun. 19, 2020.

French Search Report and Written Opinion with English machine translation dated Mar. 11, 2020 for corresponding French Application No. 1906684, filed Jun. 20, 2019.

English translation of the Written Opinion of the International Searching Authority dated Sep. 3, 2020 for corresponding International Application No. PCT/EP2020/067235, filed Jun. 19, 2020.

* cited by examiner

HYBRID TRANSACTION CARD READER SYSTEM

1. CROSS-REFERENCE TO RELATED APPLICATIONS

This Application is a Section 371 National Stage Application of International Application No. PCT/EP2020/067235, filed Jun. 19, 2020, the content of which is incorporated herein by reference in its entirety, and published as WO 2020/254651 on Dec. 24, 2020, not in English.

2. TECHNICAL FIELD

The patent application relates to a hybrid transaction card reader. The invention relates more particularly to a hybrid reader which offers significant security while ensuring a level of compactness compatible with the constraints associated with this type of device.

3. PRIOR ART

The devices and methods of the present invention described herein are useful for using a card referred to as a transaction card, which comprises one or more communication technologies.

Generally, the transaction card has at least one magnetic strip on its surface which can be swiped over a point of sale terminal to complete a transaction for payment for a good or service. The standard ISO/EEC 7810 defines the dimensions of a transaction card, generally at 85.60×53.98 millimetres. All standard transaction cards are generally 0.76 thick for one card.

A transaction card can also be in the shape of a chip card or an integrated circuit card, because it can comprise a chip. A chip card is well known in the art and has an integrated circuit capable of processing information. A chip card can receive an input that is processed through the integrated circuit or chip with an application based thereon, then provide an output. A contact chip card has a contact zone made up of several contact areas. When the contact chip card is inserted into a reader, the reader contacts electrical connectors capable of reading information on the chip and writing it back. A typical chip card follows the dimensions of ISO/IEC 7810 which determines the dimensions of the card and ISO/IEC 7816 which defines the physical location and electrical features of the chip. Contact chip cards generally do not contain batteries that are supplied by the card reader for the functions performed on the chip. Contact chip cards usually have standard communication protocols, so that a chip card can be used in different readers and that transactions can be made. Contact chip cards are used as a means for communication between a chip card and a host, and this host can be a computer, a point-of-sale terminal, a mobile phone, a transit entry point, a public telephone, etc.

Another type of transaction card is called a contactless chip card, or else a contactless card. A contactless chip card contains a chip that communicates with a card reader through RFID induction technology. A contactless chip card only requires the proximity of an antenna to complete the transaction. A contactless chip card is generally defined by the dimensions of a standard transaction card, for example, ISO/IEC 7816, and will have a standardised communication protocol, for example as defined by ISO/IEC 1443. Generally, a contactless chip card can be used for communications at distances of up to ten centimetres. The standard ISO/IEC 15693 for contactless chip cards is the one that allows communication at distances of up to 50 centimetres. Other standards may be available over greater distances for applications such as public transit and toll roads.

A transaction card can contain several technologies. For example, a transaction card may include a magnetic strip and a chip. A transaction card can include a magnetic strip, a chip and a contactless interface on a card. A chip card can have a chip and a contactless interface on a card. Sometimes a transaction card including a magnetic strip and at least one chip can be called a hybrid chip card.

To adapt to the differences that may exist between transaction card technologies, vendors provide different transaction card readers. Typically, a conventional payment terminal, found in merchants (Retail), comprises a magnetic strip card reader, usually located on the right side of the payment terminal and is in the shape of a slot into which the magnetic strip card can be swiped. A conventional payment terminal also comprises a chip card reader, which is located on the front of the terminal, under the keyboard, and into which the chip card is inserted. A conventional payment terminal can also comprise a contactless card reader which is located at the top of the display screen and on which the user can place a contactless card or another contactless device (smart watch, smartphone, etc.).

To meet specific constraints, manufacturers can also offer hybrid readers. A hybrid reader is, like a hybrid transaction card, a reader that supports two or more different technologies. This is for example a reader comprising means for reading a chip of a chip card and means for reading a strip of a magnetic strip card. Such hybrid readers can for example be integrated into automatic vending machines (of the type of petrol station pump, various vending machines) or else into automatic teller machines (ATM).

An example of a typical hybrid reader is shown in FIGS. 1 and 2. A hybrid reader is in the shape of a rectangular parallelepiped, the width dimensions of which approximate those of a transaction card defined according to the standard 7810 ID1/ID2. The length dimensions are generally much larger than the length of the transaction card. The reader comprises an upper face (upper half shell DCS) and a lower face (lower half shell DCI). These two (upper/lower) shells are assembled to form a hybrid reader (LH), comprising a slot FEN for inserting a transaction card. The upper shell comprises elements allowing to read a chip of a chip card, while the lower shell comprises a magnetic read head. More specifically, the lower shell DCI comprises an orifice ORI allowing a magnetic read head (MAG) to pivot between a read position (position wherein the head is in contact with a transaction card) and a position called rest position, position wherein the upper (generally convex) surface of the magnetic head slightly penetrates into the memory card insertion space. The upper shell, in turn, comprises a memory card connector which in particular comprises a number of "pins", each "pin" corresponding to a contact zone of a chip of a chip card. The position of the connector is conformed so that the "pins" contact the zones of the chip when the card is fully inserted into the hybrid reader (and when the transaction card comprises a chip, of course).

Thus, such readers comprise a magnetic read head present at the supposed location of the strip of the magnetic strip card (or of the hybrid card) according to the standards 7810/7811. This magnetic head is generally located in the lower zone of the reader. They also comprise a chip card connector located in the upper zone according to the standards 7810/7816.

In terms of operation, such hybrid readers are satisfactory (that is to say they are able to recognise a chip card from a magnetic strip card and switch to either one of the technologies depending on the transaction card that is presented). However, they suffer from defects related to their manufacture, particularly in terms of security and compactness.

In terms of security, first of all, as can be seen in FIGS. 1 and 2, such readers do not offer sufficient protection against attacks, in particular against the insertion of a "bug" at the magnetic read head or at the chip card connector. FIG. 1 in particular clearly shows that these two parts of the hybrid reader are easily accessible. It is therefore possible, from outside the reader (from the slot for inserting the transaction card), to insert one or more fraudulent reading devices (called a "bug"), in order to be able to fraudulently read the data of the cards which are inserted within the terminal in operation. To overcome these problems, the manufacturers thus position, around the reader, bulky parallelepipeds of printed circuits (ref AK0, FIG. 3), called chests, supposed to act as a barrier to attempts to insert bugs or spy devices. However, these chests are soldered around the hybrid reader, as shown in FIG. 3 (ref AK1, FIG. 3). The result is a more or less protected hybrid reader: it can be noted that the protection is not perfect, particularly at the insertion slot (above this slot and below this slot). Moreover, to protect the magnetic head and its tilting mechanism, which form a bulky assembly, the "protection" is extended on the right side of the reader, as shown in FIG. 3. More particularly, the hybrid reader is walled in a construction based on horizontal printed circuits (upper printed circuit and lower printed circuit) these two upper and lower printed circuits being soldered to vertical printed circuits located at the rear of the reader and on both left and right sides of the reader. There are many soldering points allowing to obtain such a formwork, leading on the one hand to a manufacturing difficulty and a difficulty in the overall maintenance of such a system: in the event of a failure inside the formwork, it is necessary to unsolder the assembly, manually, which entails a significant loss of time and numerous scrap and waste.

In terms of compactness, then, such a reader requires, as again can be seen in FIGS. 1, 2 and 3, to have sufficient thickness, in particular so that the magnetic read head has sufficient space (ref AK2, FIG. 3). This space is indeed necessary for the tilting movement of the head when inserting a transaction card. The space required is further increased due to the volume of the read head itself. This space results in a significant height of the vertical protective walls around the entire perimeter of the hybrid reader.

In the end, the system obtained (consisting of the hybrid reader and its protection in the form of printed circuits mounted and soldered in the shape of vertical and horizontal barriers) is too bulky for certain applications and is too insecure.

There is therefore a need to provide a hybrid reader which is compact and secure.

4. SUMMARY

The disclosed technique was created with these disadvantages of the prior art in mind.

More particularly, provision is made of a hybrid transaction card reader system comprising a hybrid transaction card reader and a device for protecting said hybrid reader, said hybrid transaction card reader comprising means for reading a magnetic strip and means for reading a chip, said device for protecting said hybrid reader comprising an upper protective printed circuit and a lower protective printed circuit.

Such a system is remarkable in that the device for protecting said hybrid reader further comprises a lateral protective printed circuit which comprises a superposition of unitary printed circuits, the plane of superposition of the unitary printed circuits being parallel to the plane of the upper protective printed circuit and to the plane of the lower protective printed circuit.

Thus, the proposed technique allows to make the system object of the present much more compact and secure than the solutions of the prior art.

According to a particular embodiment, the lateral protective printed circuit comprises a plurality of independent portions, soldered to the upper protective printed circuit and/or to the lower protective printed circuit.

Thus, the system of the invention is simpler to build and assemble. The manufacturing costs of a terminal embedding such a system are therefore lower, while facilitating the implementation.

According to one particular feature, the lateral protective printed circuit comprises at least one orifice for the passage of assembly screws.

Thus, the proposed system is much simpler to maintain.

According to one particular feature, the lateral protective printed circuit comprises at least one orifice for positioning at least one elastomeric connector.

Thus, the security of the system is improved by ensuring that any dismounting of the system causes a relaxation of the present elastomeric connector, and therefore a loss of the security signal and consequently an immediate detection of the fraud, allowing the implementation of security measures.

According to one particular feature, the means for reading a magnetic track of the hybrid reader comprise a magnetic read head and an inverted tilting system within which the magnetic read head is inserted.

Thus, the compactness of the read head is improved.

According to a particular embodiment, the magnetic read head comprises means for connection to a signal transmission ribbon cable.

According to a particular embodiment, the signal transmission ribbon cable comprises a flexible multilayer printed circuit, the outer layer of the flexible multilayer printed circuit comprising a protective mesh.

Thus, the magnetic read head is secured autonomously.

According to a particular embodiment, the dimensions of the protection device of said hybrid reader are shaped so as to protect access to said chip reading means.

5. BRIEF DESCRIPTION OF THE DRAWINGS

Other features and advantages of the invention will emerge more clearly upon reading the following description of a preferred embodiment, given by way of simple illustrative and non-limiting example, and the appended drawings, among which:

FIG. 1, already presented, illustrates the architecture of a hybrid reader of the prior art;

FIG. 2, already presented, is another representation of the architecture of a hybrid reader of the prior art;

FIG. 3, already presented, illustrates a hybrid reader system of the prior art, comprising a hybrid reader such as that shown in FIGS. 1 and 2 and a device for protecting this hybrid reader;

Figure 8:
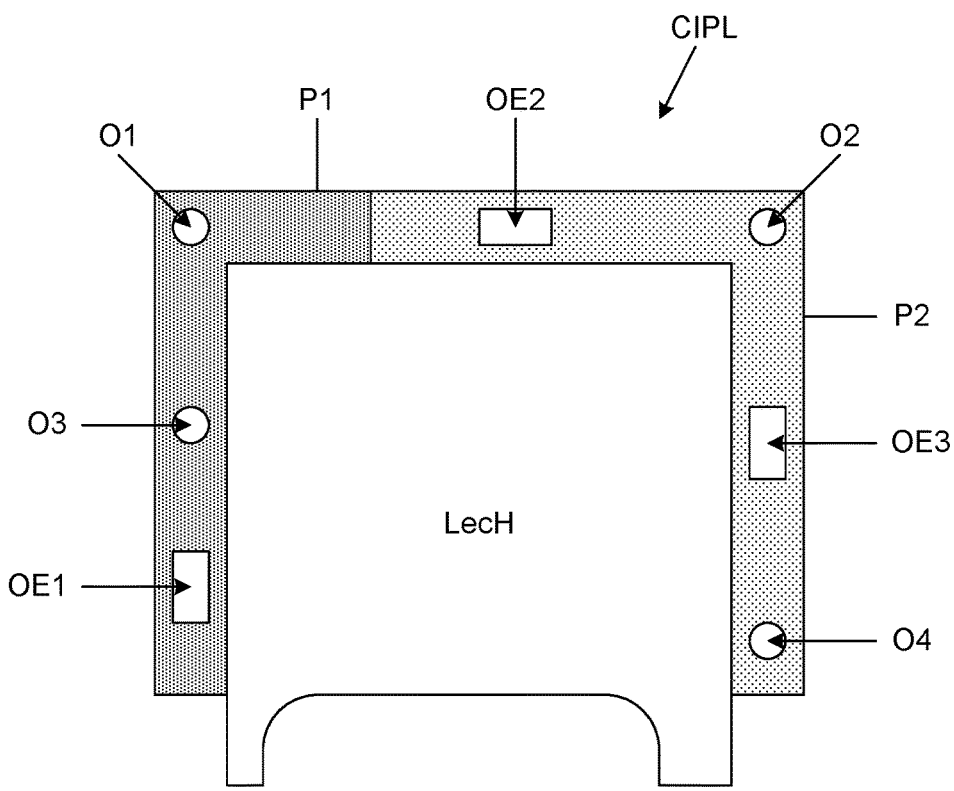
Figure 9:
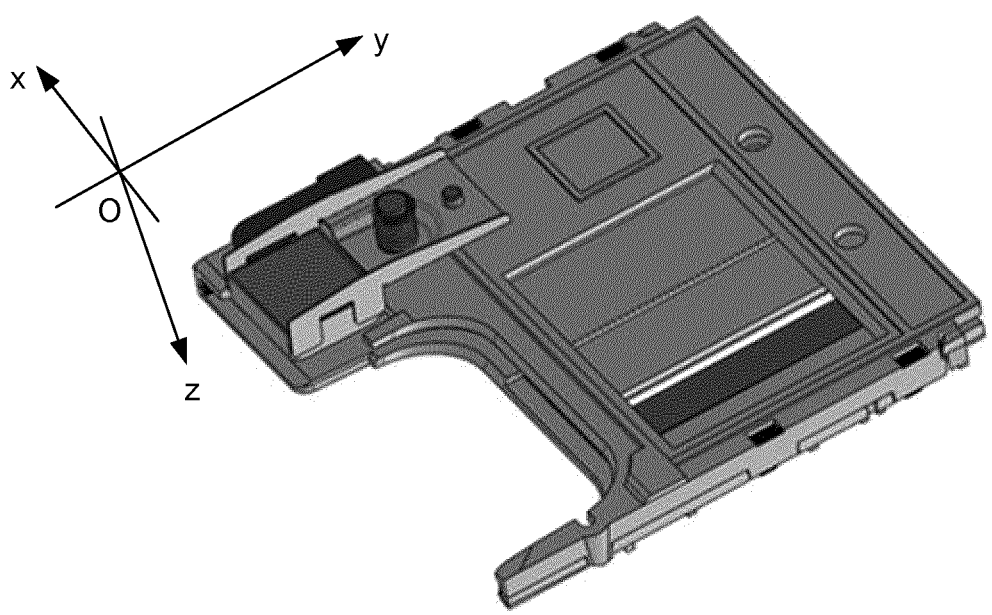

FIG. 8 also illustrates a lateral protective printed circuit according to the invention;

FIG. 9 illustrates the magnetic head tilting system according to the invention.

6. BRIEF DESCRIPTION OF ILLUSTRATIVE EMBODIMENTS

In what precedes and what follows, the descriptions carried out are made relative to a reference frame of the type (O, x, y z). The elements qualified as "upper" elements have, relative to this reference frame an altitude (z) higher than the elements qualified as "lower" elements. The notions of left, right, up and down are also to be understood as referring to this orthonormal reference (O, x, y z). Thus the left part of the hybrid reader is the one whose abscissa is closest to O while the right part of the hybrid reader is the one whose abscissa is furthest from O. The front part of the hybrid reader is the one whose ordinate is closest to O while the rear part of the hybrid reader is the one whose ordinate is furthest from O. The same reference frame is used for the description of the component elements of the hybrid reader, such as the magnetic read head, printed circuits, ribbon cables, layers, etc.

To overcome the disadvantages of the prior art, as previously described, the inventors have produced a compact hybrid reader, which is in line with the requirements of protecting the signals transmitted and received by the transaction cards on the one hand; and by the necessary downsizing of the assembly on the other hand, in order to meet the downsizing needs of these readers. Compactness and security are functions which are ensured by a system comprising a compact hybrid reader and a set of printed circuits in parallel layers, providing overall protection at the upper, lower and peripheral part of the hybrid reader. Thus, unlike a device of the prior art, which has an upper card, a lower card and three side cards, and wherein all the cards are protected by meshes, the meshes cannot however extend to the edge of the cards: a space of 0.5 mm remains at the junction of the cards which is not protected by the mesh, and which makes the device of the prior art vulnerable.

In the device of the invention, the upper and lower cards have a mesh. The side cards are replaced by "bunkers" which do not have meshes but vias which creates an impenetrable barrier with no space with the lower and upper cards. The security is much better, while obtaining a much more compact device. In addition, the vias and the meshes can be connected alternately, for example in pairs, to use an alternation in the security signals which pass through these circuits (mesh, vias) and therefore to allow to guard against a lateral drilling, which further increases the level of security.

Moreover, the inventors have eliminated the need for protection at the magnetic reader head of the hybrid reader by modifying the positioning architecture of the magnetic reader head. More particularly, the inventors have reduced the height necessary to protect the hybrid reader of the prior art by providing an alternative mechanism for protecting the magnetic read head. As the magnetic read head is protected in a different way (compared to the lateral protection of the prior art), it is therefore possible to reduce the height of the protection of the hybrid reader to the height of the hybrid reader alone, without taking into account the height and the travel of the magnetic reader head, and therefore to obtain a much more compact hybrid reader. More specifically, the head is no longer in the security envelope created by the cards, it is secured autonomously (double mesh on the FPC) which allows the height of the reader to be reduced.

Thus, according to the invention, a modification of the tilting mechanism of the magnetic read head is cleverly combined with an innovative hybrid reader lateral protection device. This combination is carried out to reduce the size of the system composed of the compact hybrid reader and the protective printed circuits while drastically increasing the security of the assembly thus obtained.

Figure 4:
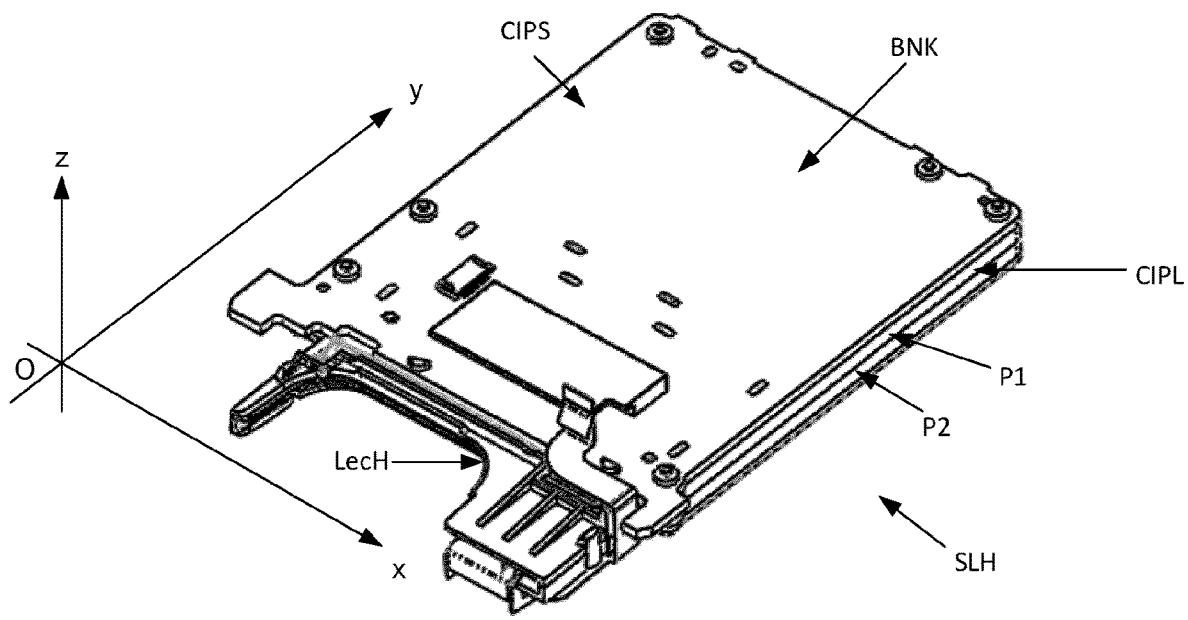
FIG. 4 illustrates a hybrid reader system according to the invention, in an isometric view.
Figure 5:
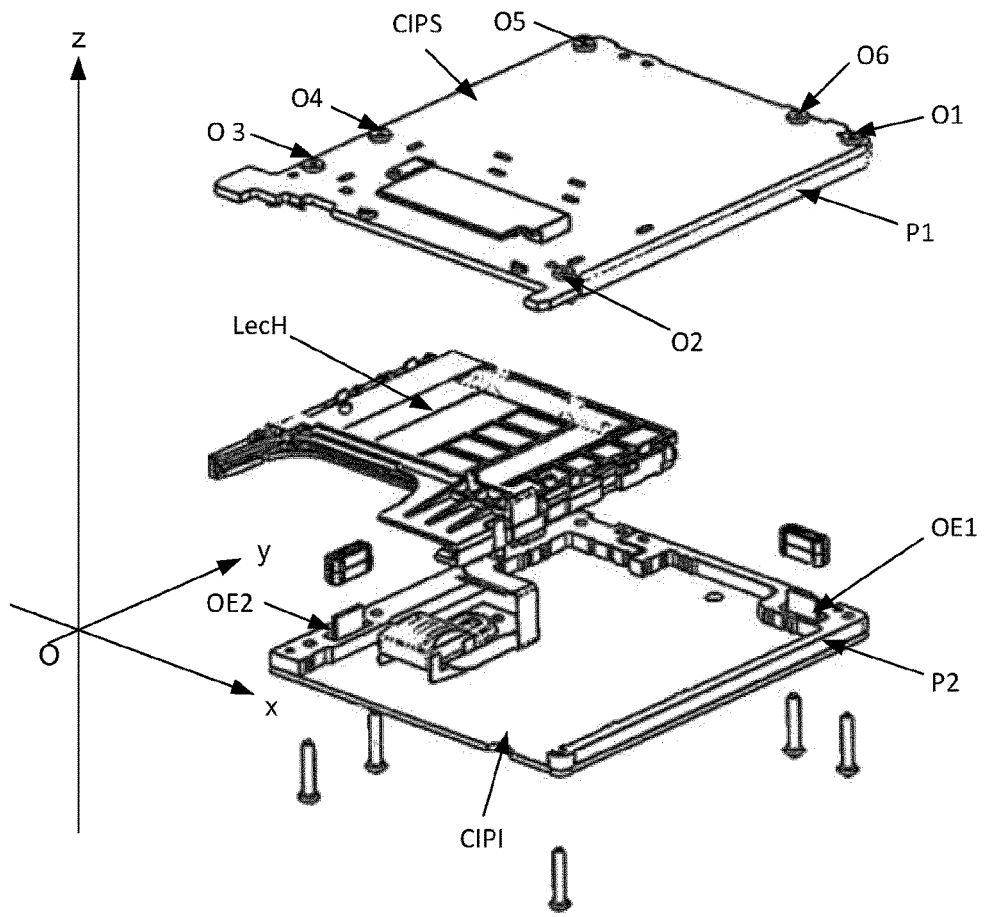
FIG. 5 is an exploded view of the hybrid reader system according to the invention in a first embodiment.
Figure 6:
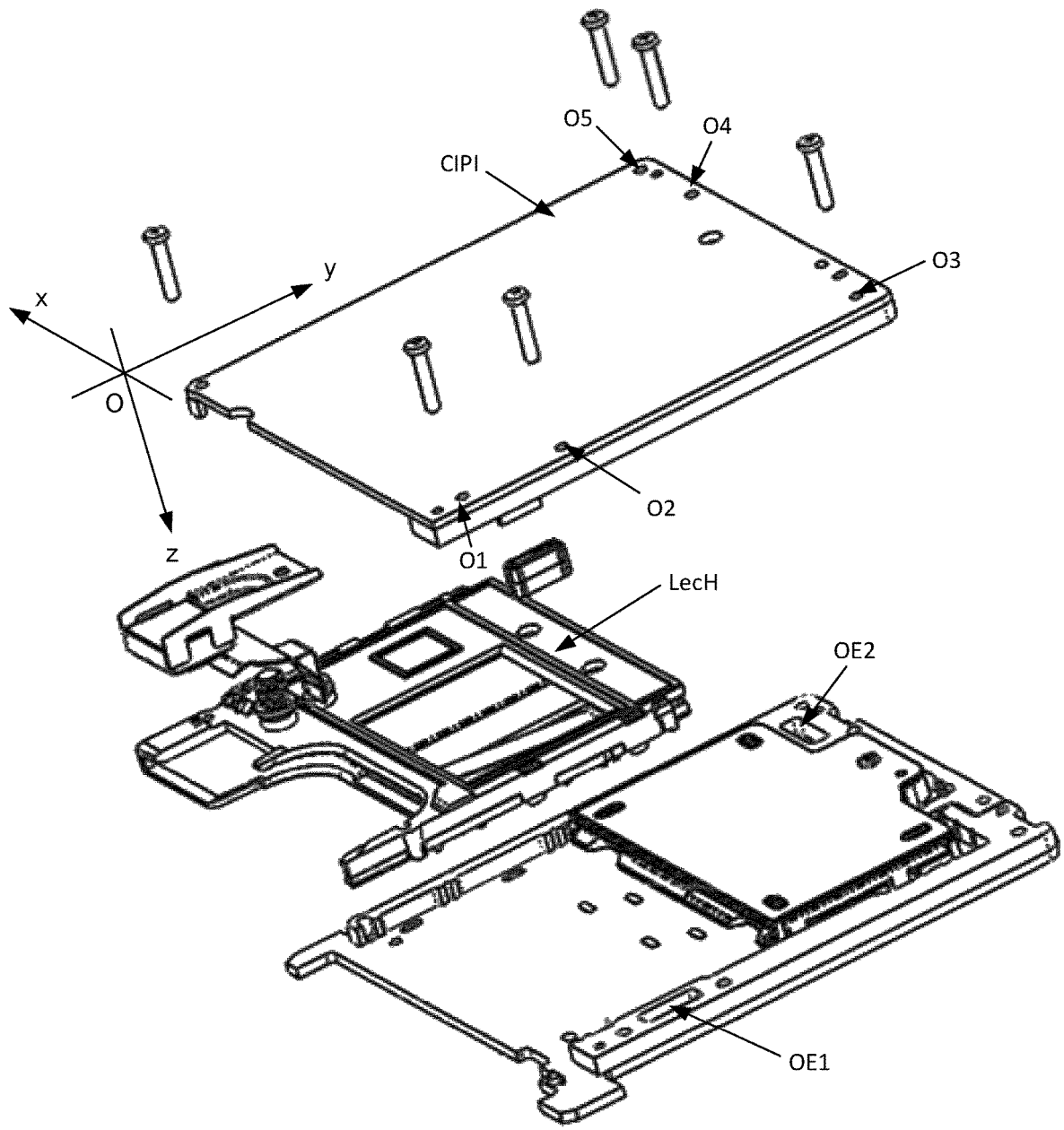
FIG. 6 is an exploded view of the hybrid reader system according to the invention in a second embodiment, incorporating a processor unit for processing transaction data.

More particularly, as described in relation to FIGS. 4, 5 and 6, the system according to the invention comprises a hybrid reader (LECH), an upper protective printed circuit (CIPS), a lower protective printed circuit (CIPI) and a lateral protective printed circuit (CIPL). In the example given in FIGS. 4, 5 and 6, the lateral protective printed circuit (CIPL) is divided into two distinct parts: upper lateral protective printed circuit (CIPLS), which is integrated/associated in parallel with the upper protective printed circuit (CIPS), and a lower lateral protective printed circuit (CIPLI), which is integrated/associated in parallel with the lower protective printed circuit (CIPI). In this exemplary embodiment, the cutting into two parts of the lateral protective printed circuit (CIPL) is carried out at mid-height thereof, and the upper lateral protective printed circuit (CIPLS) is a part of the upper protective printed circuit (CIPS). Likewise the lower lateral protective printed circuit (CIPLI) is a part of the lower protective printed circuit (CIPI).

Figure 7:
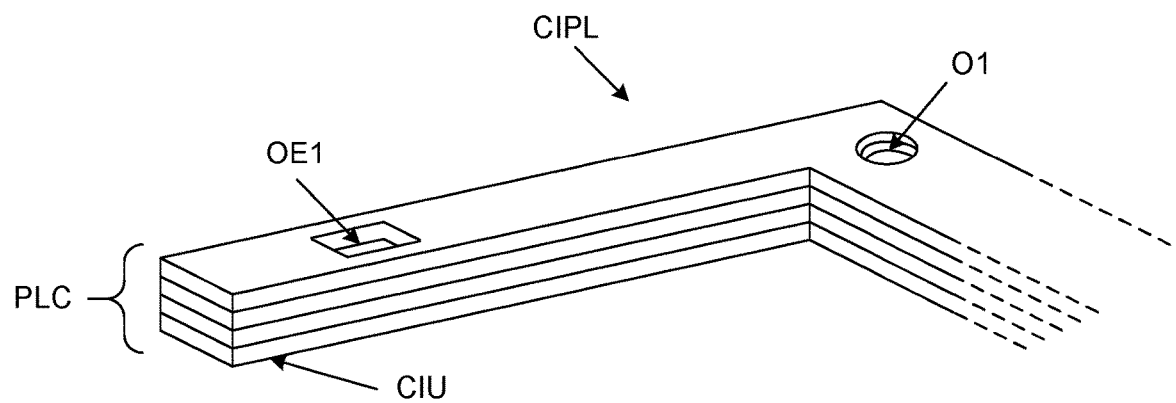
FIG. 7 illustrates a lateral protective printed circuit according to the invention.

It is understood that in other examples or embodiments the lateral protective printed circuit (CIPL) may be in the shape of an independent part of the upper protective printed circuit (CIPS) and/or the lower protective printed circuit (CIPI). It is understood that in other examples or embodiments the lateral protective printed circuit (CIPL) may, in its entirety, be a part of the upper protective printed circuit (CIPS) or the lower protective printed circuit (CIPI). Details on the lateral protective printed circuit (CIPL) are described in relation to FIGS. 7 and 8.

Regardless of the implementation of this lateral protective printed circuit (CIPL), it has the main feature of being made up of a plurality of layers (PLC) of individual printed circuit (from four to eight layers), each printed circuit layer being stacked in parallel on the previous one, to form a wall. The layers are connected to each other through vias (not shown), which allow the transmission of security signals between the layers. In other words, the hybrid reader protection device comprises a lateral protective printed circuit (cut into one or more parts) which comprises a superposition of unitary printed circuits, the superposition plane of these unitary printed circuits being parallel to the plane of the upper protective printed circuit and to the plane of the lower protective printed circuit. Each layer can individually comprise one or more protective meshes (not shown), for example connected to ground, in order to allow detection of a possible drilling or rolling. The geometry of the lateral protective printed circuit (CIPL) is adapted to the volume of the hybrid reader. More particularly, the internal shape (that is to say the shape of the walls which are closest to the hybrid reader LecH) is shaped to limit potential interstices within the "bunker" formed by the lateral protective printed circuit (CIPL), the upper protective printed circuit (CIPS) and the lower protective printed circuit (CIPI) (the geometry is obviously simplified in FIG. 8). The lateral protective printed circuit (CIPL) comprises orifices (O1, O2, O3, O4, etc.) allowing the passage of assembly screws (see below) and orifices (OE1, OE2, etc.) for positioning elastomeric connectors. These elastomeric connectors allow the transmission of security signals, for example between the upper protective printed circuit (CIPS) and the lower protective printed circuit (CIPI) to allow detection of any unauthorised attempt of opening the system. Depending on the embodiments, the upper protective printed circuits (CIPS) and the lower protective printed circuit (CIPI) may have functions other than protection functions. These may, for example, be cards incorporating inter-CPU communication functions or else power supply functions.

In addition, according to the invention, the "bunker" formed by the lateral protective printed circuit (CIPL), the upper protective printed circuit (CIPS) and the lower protective printed circuit (CIPI) is mounted using assembly screws, which are used to overcome the disadvantage of the previous solution consisting in soldering the side walls (and therefore to overcome the problem of lack of maintainability). In this way, the maintainability of the system is preserved. It should be noted that this type of mounting, using screws, is only made possible thanks to the implementation of the lateral protective printed circuit (CIPL) as previously described. Indeed, the use of several parallel layers of printed circuits to form the lateral protective printed circuit (CIPL) allows to have a sufficient thickness to form therein screw orifices allowing to secure the assembly, which is not possible with the solutions of the prior art. The lateral protective printed circuit (CIPL) can be made up of several independent portions (P1, P2, etc.), which are assembled one by one in parallel on the upper protective printed circuit (CIPS) and/or the lower protective printed circuit (CIPI) in order to facilitate on the one hand the manufacture of the lateral protective printed circuit (CIPL) and on the other hand the mounting thereof. The advantage, for the manufacture, lies in the relative ease of manufacturing such portions, which are relatively rectilinear, and do not require overly complex designs. Moreover, such manufacturing is advantageous in terms of cost because it avoids having to pay for lost material (that is to say for cut printed circuit portions, which although being discarded are still invoiced). From the point of view of mounting, also such a procedure is advantageous because it allows to position the different portions successively and in parallel, without excessive difficulty of alignment. The bunker allows to protect all the functions implemented at the chip card connector. The reading functions at the magnetic head are devoid of the protection provided by the bunker. Consequently, the bunker has the overall shape of a rectangular parallelepiped, without the protrusion at the magnetic read head.

Figure 1:
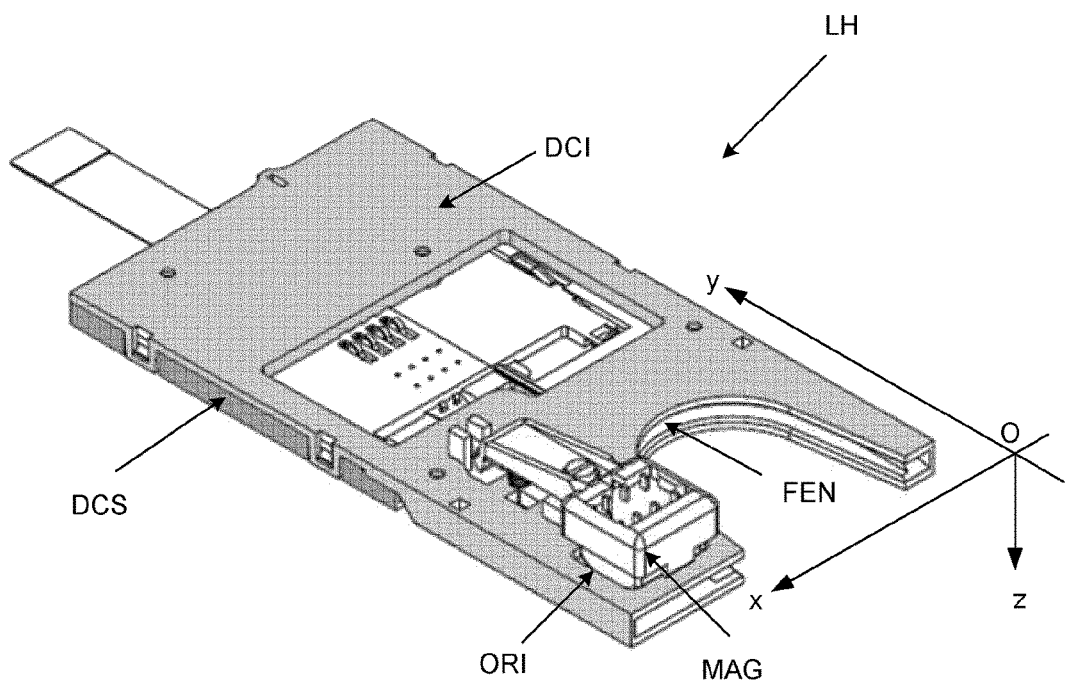

In addition, according to the invention, a hybrid reader comprises a compact magnetic read head, associated with a reverse tilting system. Compact means a magnetic read head whose length and width are respectively comprised between 10 and 20 millimetres and whose height is comprised between 5 and 15 millimetres. The combination of these two features allows to reduce by half the thickness necessary for the implementation of the magnetic head and therefore to meet the imperative of compactness and that of security, as explained below, in relation with FIG. 9. With regard to compactness, the inverted construction of the tilting system of the magnetic read head comprises a magnetic head support, of longitudinal shape, comprising a securing portion, allowing to clamp and hold the magnetic read head. In the embodiment shown, the securing portion comprises four clamping tabs, two on each side of the head. The securing portion is followed by a flat portion, comprising two orifices: the first orifice is used to accommodate a support stud for a return means (here a spring), the support stud comprising at its base a disc for stopping the return means. Thus, when the head is moved, for example by the insertion of a card, the head is released to receive the card, then, when the card is withdrawn, the inverted return means allows the magnetic read head to resume its place in the orifice assigned thereto. The advantage of this embodiment is that there is no provision for a tilting system, as in the hybrid readers of the prior art, but instead a translation system, thus allowing the use of a return means of a lower height, and ultimately allowing to obtain hybrid reader of lower thickness. In comparison with the device of FIG. 1, the reduction in height is more than 50%. Moreover, the technique used also increases security.

Figure 2:
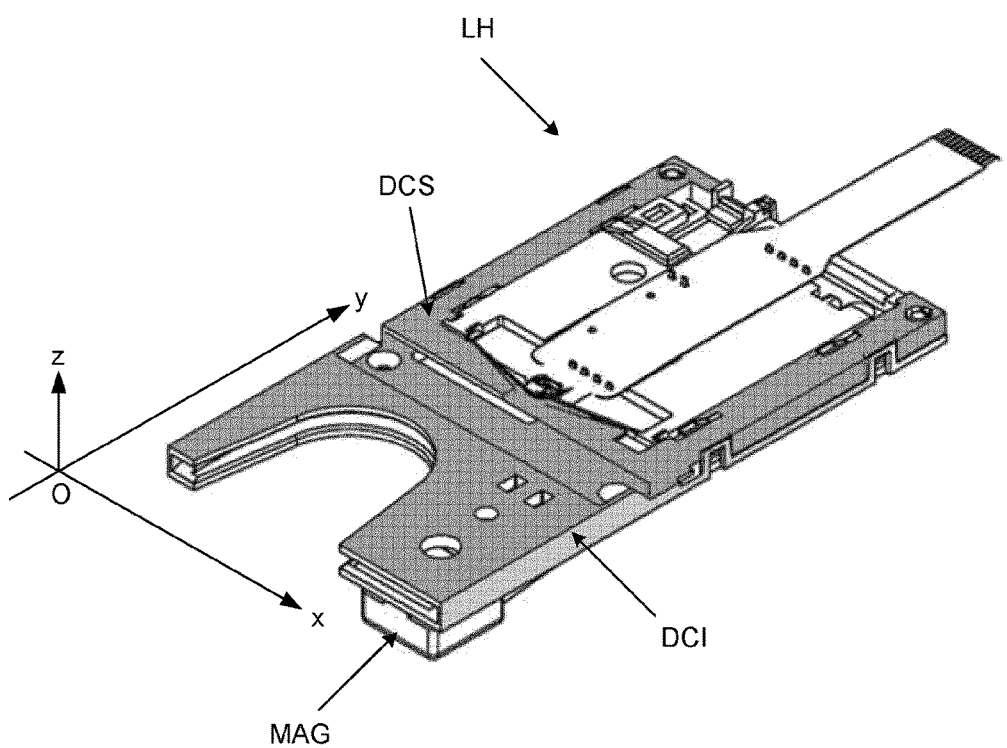
Figure 3:
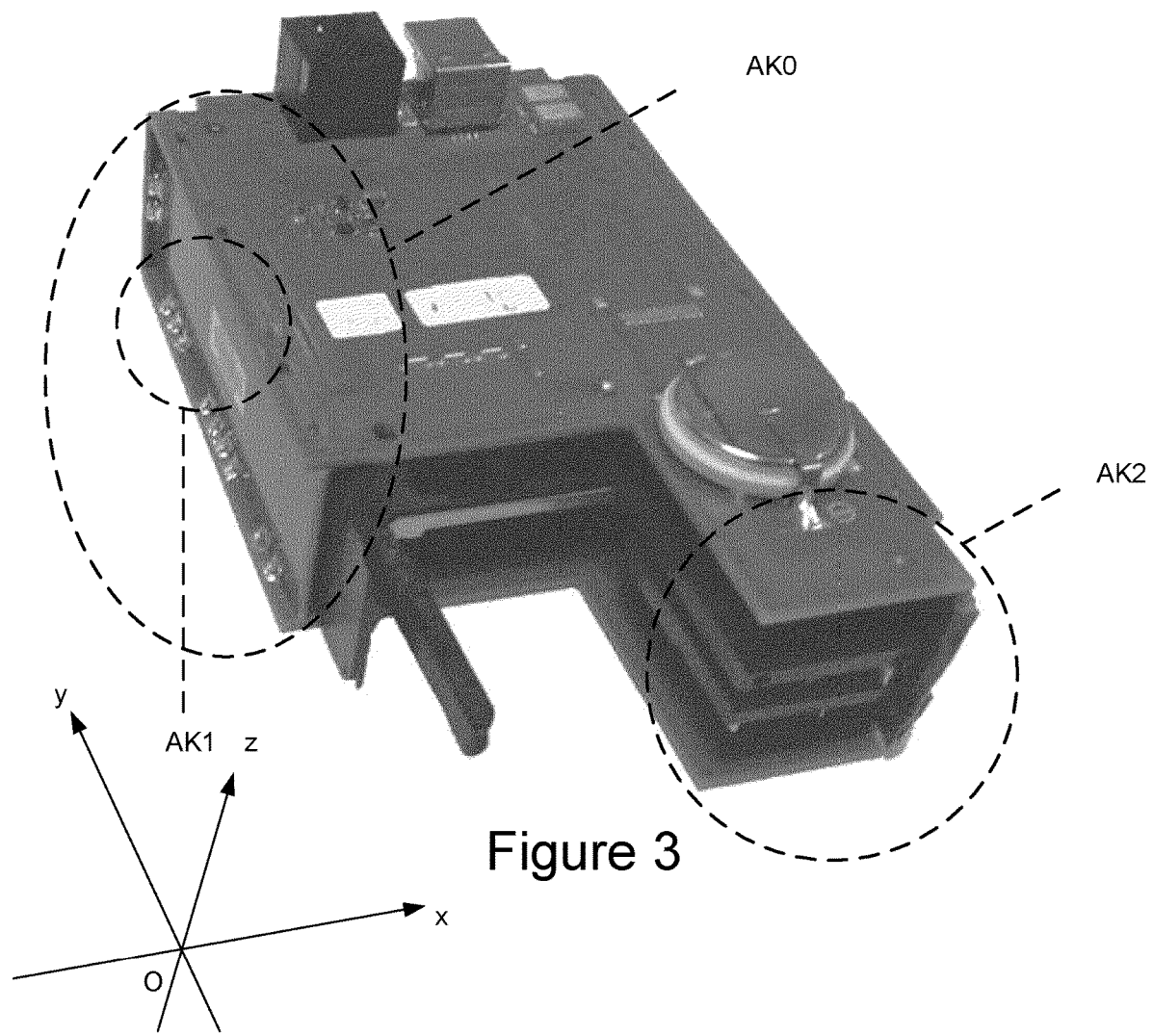

As for the magnetic read head itself, the connection thereof to a printed circuit is made via a ribbon cable, in the form of a flexible printed circuit. This ribbon cable is connected to the magnetic read head from below, with the particularity of releasing the connection ribbon cable to the outside (right side) of the hybrid reader. In this way, it is not possible to access the signals from below the magnetic head (prior art). On the contrary, the ribbon cable which is laterally connected to the magnetic head is shaped to be connected to a secure portion of the hybrid system of the invention. According to the invention, the ribbon cable consists of a flexible multilayer (at least double layer) printed circuit, wherein the outer layer (that is to say the layer which does not transport the signals resulting from the reading of the magnetic card), comprises a protective mesh. In this way, the signals coming from magnetic strips are not accessible by introducing a bug under the magnetic read head, as in the example of FIG. 1 or 2. Thus, the compactness of the hybrid reader system (SLH) does not contravene the security of the signals which are emitted from the magnetic head. Moreover, the protective mesh of this ribbon cable is connected to an intrusion detection mechanism, involving the triggering of a measure to protect the hybrid reader system in the event of an attempt to roll or drill this flexible ribbon cable. In addition, even if the attacker tries to insert a bug at the magnetic head, it is prevented. Indeed, if the bug is placed in front of the head (a known attack is to place a false front face over the real one) the card will sink too far and cannot be pulled out, thanks to the proposed implementation. It is therefore a more than effective improvement in blocking this type of attempt. Finally, the bug cannot be placed behind the head (which is possible with the old reader in FIGS. 1 and 2).

Although the present disclosure has been described with reference to one or more examples, workers skilled in the art will recognize that changes may be made in form and detail without departing from the scope of the disclosure and/or the appended claims.

The invention claimed is:

1. A hybrid transaction card reader system comprising:
a hybrid transaction card reader comprising magnetic strip reader, a chip reader and a slot to receive a card supporting at least one of an integrated circuit chip or a magnetic strip; and
a protection device for protecting the chip reader, the protection device comprising:
an upper protective printed circuit;
a lower protective printed circuit; and
a lateral protective printed circuit, which comprises a superposition of unitary printed circuits, a plane of the superposition of the unitary printed circuits being parallel to a plane of the upper protective printed circuit and to a plane of the lower protective printed circuit, wherein the chip reader is located in a space between the upper, lower and lateral protective printed circuits.

2. The hybrid transaction card reader system according to claim 1, wherein the lateral protective printed circuit comprises a plurality of independent portions soldered to the upper protective printed circuit and/or to the lower protective printed circuit.

3. The hybrid transaction card reader system according to claim 1, wherein the lateral protective printed circuit comprises at least one orifice for the passage of assembly screws.

4. The hybrid transaction card reader system according to claim 1, wherein the lateral protective printed circuit comprises at least one orifice for positioning at least one elastomeric connector.

5. The hybrid transaction card reader system according to claim 1, wherein the magnetic strip reader comprises a magnetic read head and an inverted tilting system within which the magnetic read head is inserted.

6. The hybrid transaction card reader system according to claim 5, wherein the magnetic read head comprises a connector for connecting to a signal transmission ribbon cable.

7. The hybrid transaction card reader system according to claim 6, wherein the signal transmission ribbon cable comprises a flexible multilayer printed circuit, an outer layer of the flexible multilayer printed circuit comprising a protective mesh.

8. The hybrid transaction card reader system according to claim 1, wherein dimensions of the protection device are shaped so as to protect access to said chip reader.

* * * * *